US011862008B2

(12) United States Patent
Hassen et al.

(10) Patent No.: US 11,862,008 B2
(45) Date of Patent: Jan. 2, 2024

(54) METHODS, DEVICES, AND COMPUTER READABLE MEDIA FOR PERCEPTUAL CLOSED-LOOP CONTROL AND EQUALIZATION OF VIBROTACTILE SYSTEMS

(71) Applicant: Huawei Technologies Co., Ltd., Shenzhen (CN)

(72) Inventors: Rania Hassen, Milton (CA); Wei Li, Richmond Hill (CA); Da-Yuan Huang, Markham (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 219 days.

(21) Appl. No.: 17/347,429

(22) Filed: Jun. 14, 2021

(65) Prior Publication Data
US 2022/0398906 A1 Dec. 15, 2022

(51) Int. Cl.
*G08B 6/00* (2006.01)
(52) U.S. Cl.
CPC .................. *G08B 6/00* (2013.01)
(58) Field of Classification Search
CPC ........................................................ G08B 6/00
USPC ...................................................... 340/407.1
See application file for complete search history.

(56) References Cited

U.S. PATENT DOCUMENTS

| | | | | |
|---|---|---|---|---|
| 2019/0123664 A1* | 4/2019 | Shimada | ................ | G02B 7/02 |
| 2020/0150768 A1* | 5/2020 | Kim | ........................ | G06F 3/016 |
| 2022/0094253 A1* | 3/2022 | Houston | ................ | H02K 7/003 |
| 2022/0155900 A1* | 5/2022 | Sanz-Robinson | ..... | G06F 3/0414 |
| 2023/0109195 A1* | 4/2023 | Cella | ...................... | G06Q 30/06 |
| | | | | 702/188 |

OTHER PUBLICATIONS

W. McMahan and K. J. Kuchenbecker, "Dynamic modeling and control of voice-coil actuators for high-fidelity display of haptic vibrations", 2014 IEEE Haptics Symposium, Haptics. 115-122. https://doi.org/10.1109/HAPTICS.2014.6775442.

Ha-Van Quang and Matthias Harders. 2016. "Improved Control Methods for Vibrotactile Rendering", In Proceedings, Part I, of the 10th International Conference on Haptics: Perception, Devices, Control, and Applications—vol. 9774 (EuroHaptics 2016). Springer-Verlag, Berlin, Heidelberg, 217-228. https://doi.org/10.1007/978-3-319-42321-0_20.

(Continued)

*Primary Examiner* — Jack K Wang
(74) *Attorney, Agent, or Firm* — Slater Matsil, LLP

(57) ABSTRACT

A method to correct a haptic output, the method including sending, at a device, a reference tactile signal to a haptic actuator and recording, using a sensor associated with the haptic actuator, an output signal from the haptic actuator. This output signal could be provided, along with the reference tactile signal to an engine at the device, which could be used to determine regions of perceptual distortion from the output signal and the reference tactile signal. Specifically, a perceptual similarity measure could be determined which could be used to generate an adapted signal to reduce and equalize the perceptual distortion, where the adapted signal could be provided to the haptic actuator to control adaptation or equalization of distortions.

20 Claims, 12 Drawing Sheets

(56) References Cited

OTHER PUBLICATIONS

Y. Ujitoko, S. Sakurai and K. Hirota, "Vibrator Transparency: Re-using Vibrotactile Signal Assets for Different Black Box Vibrators without Re-designing," 2020 IEEE Haptics Symposium (Haptics), 2020, 882-889. https://doi.org/10.1109/HAPTICS45997.2020.ras.HAP20.80.00957e94.

Bukkapatnam, A.T., Depalle, P. & Wanderley, M.M., "Defining a vibrotactile toolkit for digital musical instruments: characterizing voice coil actuators, effects of loading, and equalization of the frequency response", Journal on Multimodal User Interfaces, 14, 285-301 (2020). https://doi.org/10.1007/s12193-020-00340-0.

A. Noll, C.-D. Curiac, B. Gülecyüz and E. Steinbach, "Adaptive Equalization of Vibrotactile Actuators," in IEEE Transactions on Haptics, vol. 14, No. 2, 371-383, Apr. 1-Jun. 2021. https://doi.org/10.1109/TOH.2020.3032852.

\* cited by examiner

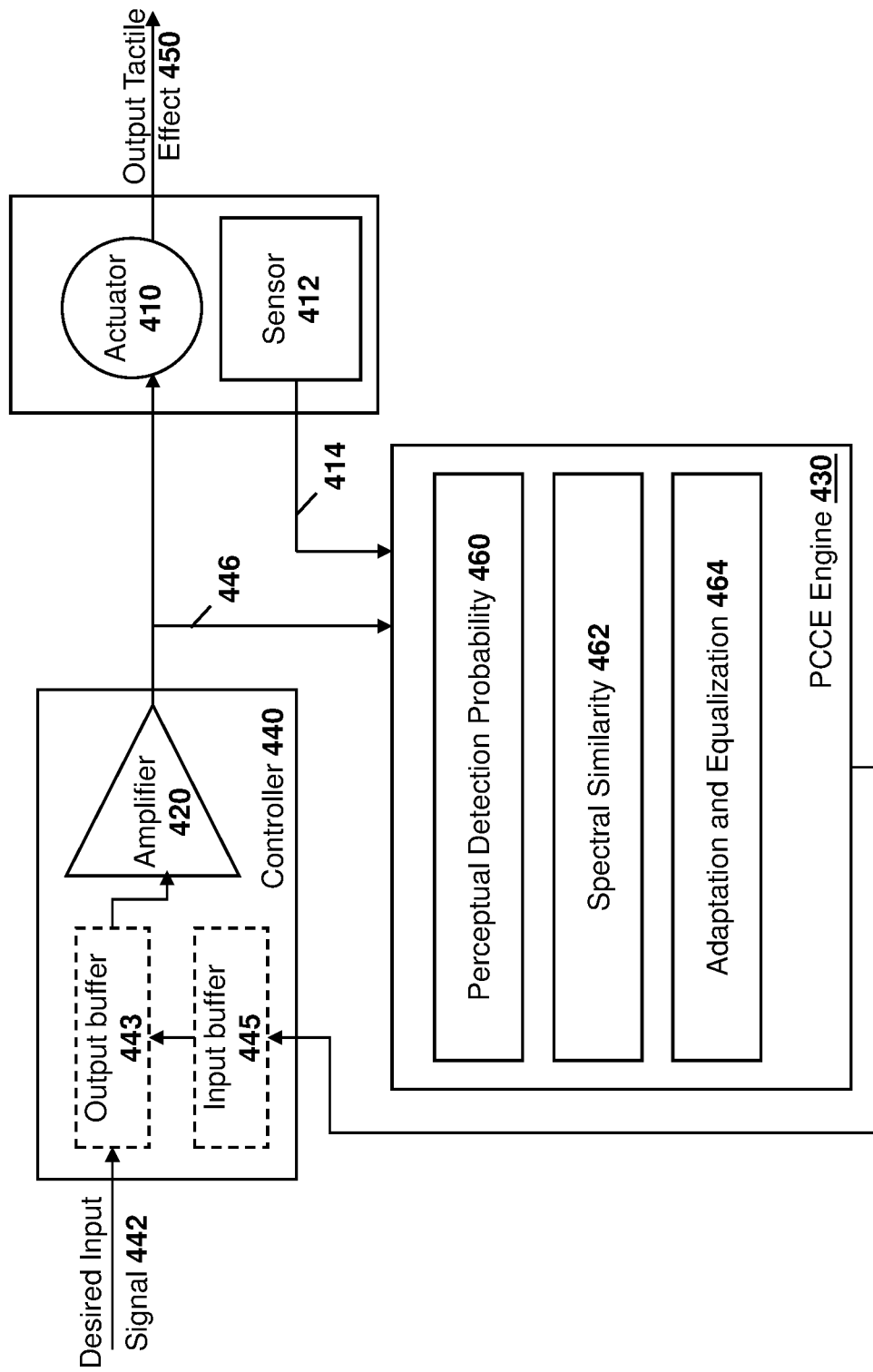

METHODS, DEVICES, AND COMPUTER READABLE MEDIA FOR PERCEPTUAL CLOSED-LOOP CONTROL AND EQUALIZATION OF VIBROTACTILE SYSTEMS

FIELD OF THE DISCLOSURE

The present disclosure relates to electronic devices, and in particular relates to electronic devices that generate tactile outputs to provide haptic feedback to a user.

BACKGROUND

Haptics relate to the use of tactile sensations in interfaces, and in general deal with anything related to the sense of touch. Examples include vibration of a mobile phone or wearable, or a rumble in a game controller. Haptics however have many applications, including artificial reality/virtual reality (AR/VR) experiences, infotainment systems, industrial and military simulations, among others.

Haptic feedback can be created using motors to create vibrations but could also include other technologies such as the use of microfluidics, levers or other mechanical devices, or friction modulation, among other examples.

Haptics improve the usability of electronic devices in general, and in particular may make manipulation of a user-interface object on touch-sensitive surfaces more efficient and intuitive for a user, thereby creating more efficient human-machine interfaces.

Creating an effective vibrotactile rendering system lies in selecting vibrotactile actuators from a wide range of actuators with different technology flavors, and arranging and mounting these actuators to create consistent haptic feedback when coupled with user's skin. The constraints imposed by a particular application may require different creative solutions to ensure such consistent feedbacks.

Pristine tactile effects, which are rendered using vibrotactile actuators, are designed to simulate a variety of tactile sensations with different vibration amplitudes, frequencies, waveforms, and/or envelopes. Many of the actuator models differ in multiple mechanical and electrical characteristics that generally include size, form, cost, robustness, response time, expressiveness, and power consumption. These different actuator models deliver distinct haptic experiences, but common to all, they introduce irregularities and distortions to the pristine input effects when rendered.

Actuator distortions refer to any deviations in the actuator output that do not present in the actuator input which might be due to many factors. Some of these factors are the operating specification of an actuator, the preceding driving stage, the structure of a case containing the actuator, and the loading condition with which the actuator case is mechanically coupled to the user. Such distortions can be distracting, annoying, or inconvenient and can reduce the quality of the user experience.

SUMMARY

The present disclosure provides for the removal or reduction of perceptual distortions in the output of a haptic actuator such as a vibrotactile actuator.

In particular, in some embodiments, a Perceptual Close-loop Control and Equalization engine is provided on a device to receive both input tactile effect signals and signals output from at least one sensor associated with the haptic actuator. The engine may be configured to determine regions of perpetual distortion and to generate a corrective signal that is provided to a controller to reduce and equalize perceptual distortions in the regions of perceptual distortion. In this way, the haptic output perceived by a user of the device is closer to the intended haptic output, thereby providing a cleaner output tactile effect.

In some cases, the engine may consist of various logical modules to transform the input tactile effect signal and sensors output from the at least one sensor into perceptual representation. A spectral similarity unit at the engine may then determine a degree of similarity between the perceptual representations of reference tactile signal and the output signal. An adaptation and equalization module at the engine could then create the corrective signal for the controller.

In some cases, the reference tactile signal and the recorded output signal may be converted into perceptual representations at a first unit of the engine to allow corrections on perceived input.

In some cases, a degree of similarity between the perceptual representations of reference tactile signal and the output signal obtained from the first unit at a second unit of the engine may be determined.

In some cases, an equalization filter may be adjusted to target frequency regions with a threshold perceptual distortion level in the output signal at a third unit of the engine. This may include adjusting the equalization filter center frequency, gain, and/or bandwidth.

Therefore, in a first aspect, the present disclosure provides for a method for correcting a haptic output. A device obtains a reference tactile signal to a haptic actuator. A sensor associated with the haptic actuator records an output signal from the haptic actuator. The output signal and the reference tactile signal are provided to an engine at the device. The engine may be used to determine regions of perceptual distortion from the output signal and the reference tactile signal. The device may then generate an adapted signal to reduce and equalize perceptual distortion in the determined regions of perceptual distortion and provide the adapted signal to the haptic actuator.

According to one implementation, the providing the adapted signal comprises sending the adapted signal from the engine to an input buffer of a controller; and choosing, at the controller, the adapted signal from the input buffer over the reference tactile signal to provide to the haptic actuator.

According to some implementations, the generation in the first implementation comprises providing the reference tactile signal as the adapted signal when the engine detects no perceptible distortions.

According to some implementations of the method according to the first aspect further comprises transforming the reference tactile signal and the recorded output signal into perceptual representations at a first unit of the engine.

According to some implementations of the method according to the first aspect further comprises determining a degree of similarity between the perceptual representations of reference tactile signal and the output signal obtained from the first unit at a second unit of the engine.

According to some implementations of the method according to the first aspect the engine further comprises adjusting an equalization filter to target multiple frequency regions.

According to some implementations of the method according to the first aspect, the haptic actuator is a vibrotactile actuator.

In a second aspect, a device configured to correct a haptic output is provided. The device includes a processor; a haptic actuator; and a sensor associated with the haptic actuator. In accordance with the second aspect, the device is configured to send a reference tactile signal to the haptic actuator; record, using the sensor associated with the haptic actuator, an output signal from the haptic actuator; provide the reference tactile signal and the output signal to an engine at the device; determine regions of perceptual distortion from the output signal and the reference tactile signal; generate an adapted signal to reduce and equalize perceptual distortion in the determined regions of perceptual distortion; and provide the adapted signal to the haptic actuator.

In one implementation of the device of the second aspect, the device is further configured to provide the adapted signal by sending the adapted signal from the engine to an input buffer of a controller; and choosing, at the controller, the adapted signal from the input buffer to provide to the haptic actuator.

In some implementations of the device of the second aspect, the engine at the device comprises a first unit to transform the reference tactile signal and the output signal into perceptual representations.

In some implementations of the device of the second aspect the engine at the device further includes a second unit to determine a degree of similarity between the perceptual representations of reference tactile signal and the output signal obtained from the first unit.

In some implementations of the device of the second aspect the engine at the device further includes a third unit to adjust an adaptation filter to target frequency bands with a threshold perceptual distortion level in the output signal. In one example the adjustment of the adaptation filter comprises adjusting a band-pass filter targeted at perceptual distortions over the threshold perceptual distortion level.

In some implementations of the device of the second aspect the haptic actuator is a vibrotactile actuator.

In a third aspect a non-transitory computer readable medium for storing instruction code is provided, where the instruction code may be executed by a processor of a device. When executed, the instruction code may cause the device to send a reference tactile signal to a haptic actuator; record, using a sensor associated with the haptic actuator, an output signal from the haptic actuator; provide the reference tactile signal and the output signal to an engine at the device; determine regions of perceptual distortion from the output signal and the reference tactile signal; generate an adapted signal to reduce and equalize perceptual distortion in the determined regions of perceptual distortion; and provide the adapted signal to the haptic actuator.

In a fourth aspect, a method at a device to correct a haptic output display is provided. The device causes the sending of reference tactile signals to at least two haptic actuators. Sensors associated with the at least two haptic actuators record output signals from the at least two haptic actuators. Multi-channel separation of the output signals may then be performed at the device to create separated output signals. The reference tactile signals and the separated output signals may then be provided to an engine at the device. The device may then determine, using the engine, regions of perceptual distortion from the output signal and the reference tactile signal. The device may then generate adapted signals to reduce and equalize perceptual distortion in the regions of perceptual distortion and provide the adapted signals to the at least two haptic actuators.

In one implementation of the method of the fourth aspect, generating the second signals is done at a tactile feedback controller which uses the reference tactile signals and separated outputs from the engine to generate the adapted signals.

In one case, the generating comprises providing the reference tactile signals as the adapted signals when the engine detects no perceptible distortions.

In some implementations of the method of the fourth aspect the engine comprises a first unit to transform each reference tactile signal and output signal into perceptual representations.

In some implementations of the method of the fourth aspect the engine further includes a second unit to determine a degree of similarity between the perceptual representations of reference tactile signals and the separated output signals obtained from the first unit.

In some implementations of the method of the fourth aspect the engine further includes a third unit to adjust an adaptation filter to target frequency bands with a threshold perceptual distortion level in the output signals.

In some implementations of the method of the fourth aspect adjustment of adaptation filter comprises adjusting a band-pass filter targeted at perceptual distortions over the threshold perceptual distortion level.

In some implementations of the method of the fourth aspect, wherein at least two haptic actuators are vibrotactile actuators.

In a fifth aspect, a device is configured to correct a haptic output display. The device includes a processor; at least two haptic actuators; and sensors associated with the at least two haptic actuators. In this aspect, the device is configured to send reference tactile signals to the at least two haptic actuators and record, using the sensors associated with the at least two haptic actuator, output signals from the at least two haptic actuators. The device is further configured to perform multi-channel separation of the output signals to create separated output signals. These reference tactile signals and the separated output signals are then provided by the device to an engine, which is used to determine regions of perceptual distortion from the output signal and the reference tactile signal. The device is further configured to generate adapted signals to reduce and equalize perceptual distortion in the regions of perceptual distortion and provide the adapted signals to the at least two haptic actuators.

In one implementation of the device of the fifth aspect, the device is configured to generate the adapted signals at a tactile feedback controller which uses the reference tactile signals and separated outputs from the engine to generate the adapted signals.

In some implementations of the device of the fifth aspect, the device is configured to generate by providing the reference tactile signals as the adapted signals when the engine detects no perceptible distortions.

In some implementations of the device of the fifth aspect, the engine comprises a first unit to transform each reference tactile signal from the reference tactile signals into a perceptual representation.

In some implementations of the device of the fifth aspect, the engine further includes a second unit to determine a degree of similarity between the perceptual representations of reference tactile signals and the separated output signals obtained from the first unit.

In some implementations of the device of the fifth aspect the engine further includes a third unit to adjust an adaptation filter to target frequency bands with a threshold perceptual distortion level in the output signal.

In some implementations of the device of the fifth aspect, adjustment of adaptation filter comprises adjusting a band-pass filter targeted at perceptual distortions over the threshold perceptual distortion level.

In some implementations of the device of the fifth aspect, the at least two haptic actuators are vibrotactile actuators.

In a sixth aspect, a non-transitory computer readable medium for storing instruction code is provided. The instruction code, when executed by a processor of a device cause the device to send reference tactile signals to the at least two haptic actuators and record, using the sensors associated with the at least two haptic actuators, output signals from the at least two haptic actuators. The instruction code further causes the device to perform multi-channel separation of the output signals to create separated output signals. The reference tactile signals and the separated output signals are provided to an engine at the device which is used to determine regions of perceptual distortion from the output signal and the reference tactile signal. The device may further generate adapted signals to reduce and equalize perceptual distortion in the regions of perceptual distortion and provide the adapted signals to the at least two haptic actuators.

The embodiments of the present disclosure provide for a perceptual closed-loop control and equalization engine of haptic actuators that reduces or eliminates perceived distortions. The engine relies on perceptual measure to isolate perceptible distortions in the actuator output from those imperceptible ones. Then a control scheme directs the equalization engine to target such distortions. This in turn helps improve actuator performance in terms of feedback consistency and high quality.

BRIEF DESCRIPTION OF THE DRAWINGS

The present disclosure will be better understood with reference to the drawings, in which:

FIG. 4 is a block diagram of a device with a single haptic actuator and sensor for perceptual distortion correction in a haptic display;

DETAILED DESCRIPTION

According to the embodiments of the present disclosure, methods and systems are provided for electronic devices to provide haptic feedback in different consumer devices that help the user understand the connection between the user input and the device response to input.

While many forms of haptic feedback exist, the most common form of haptic feedback is vibrations or vibrotactile effects that are provided using various types of vibrotactile actuators (also known as vibrotactile displays). In this regard, the present disclosure is described below with regards to vibrotactile actuators. However, the present disclosure is not limited to vibrotactile actuators, and other haptic feedback devices or actuators could equally be used.

Creating an effective vibrotactile rendering system lies in two phases. A first involves selecting vibrotactile actuators from a wide range of actuators with different technology flavors. A second involves arranging and mounting these actuators to create consistent haptic feedback when coupled with a user's skin.

In a high-fidelity system, the output faithfully represents the input without any distortions. However, in practice, in some situations strong spectral components may occur more than the input fundamental, particularly when the transducer cannot physically reproduce the input fundamental at the desired level. Distortions can also be falsely high at lower frequencies when the actuator's output amplitude is low.

Similarly, vibrotactile systems that exhibit harmonic distortion can produce harmonics that are suprathreshold. Specifically, a stimulus of a lower frequency can be unintentionally perceived due to the presence of a higher harmonic frequency occurring above the threshold of perception, therefore suggesting the need for distortion measurements when using such interfaces. Such variable distortions can be a challenge to ensure high quality and consistent haptic effects across a range of different vibrotactile systems.

Figure 1:
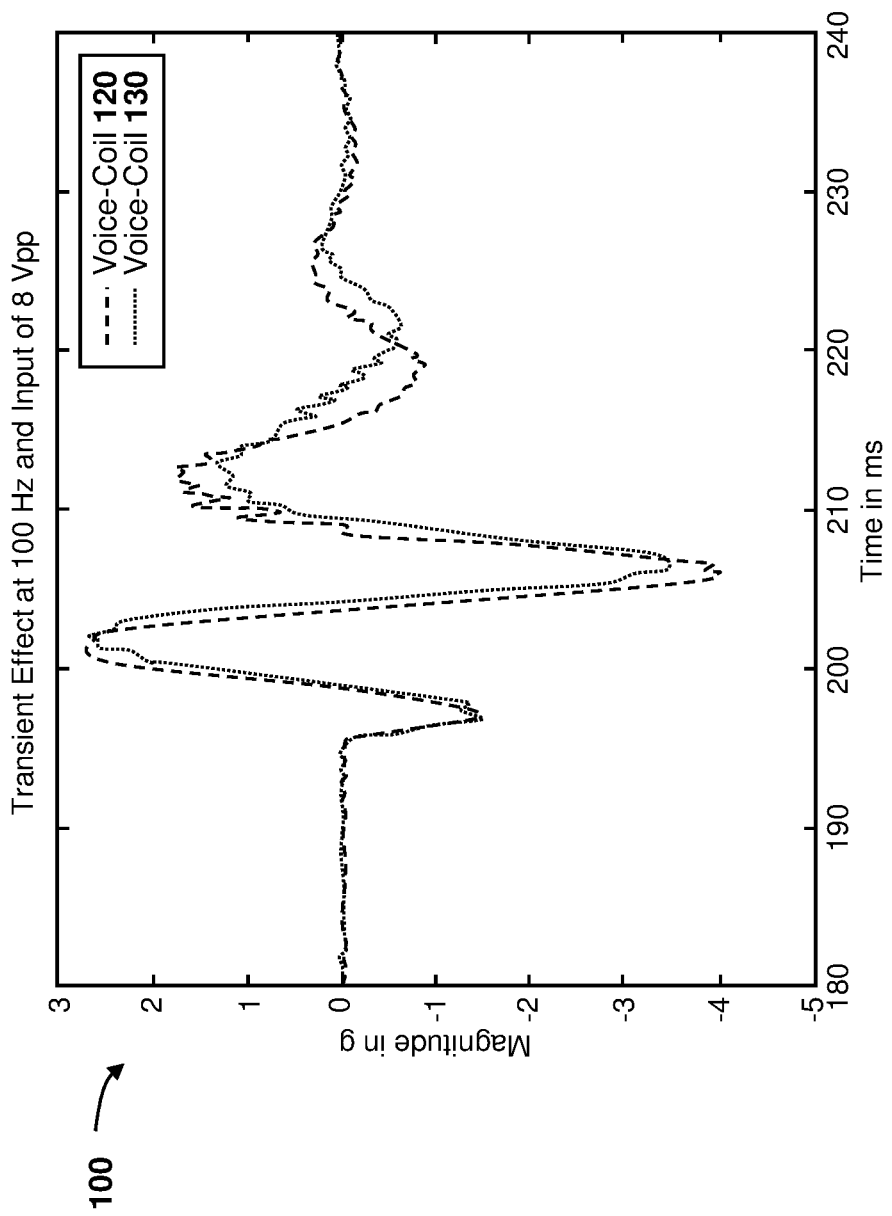
FIG. 1 is a graph of transient effect distortions found in two similar voice-coil actuator models at 100 Hz using a 100 gram load tested in a handheld form-factor prototype device.
Figure 2:
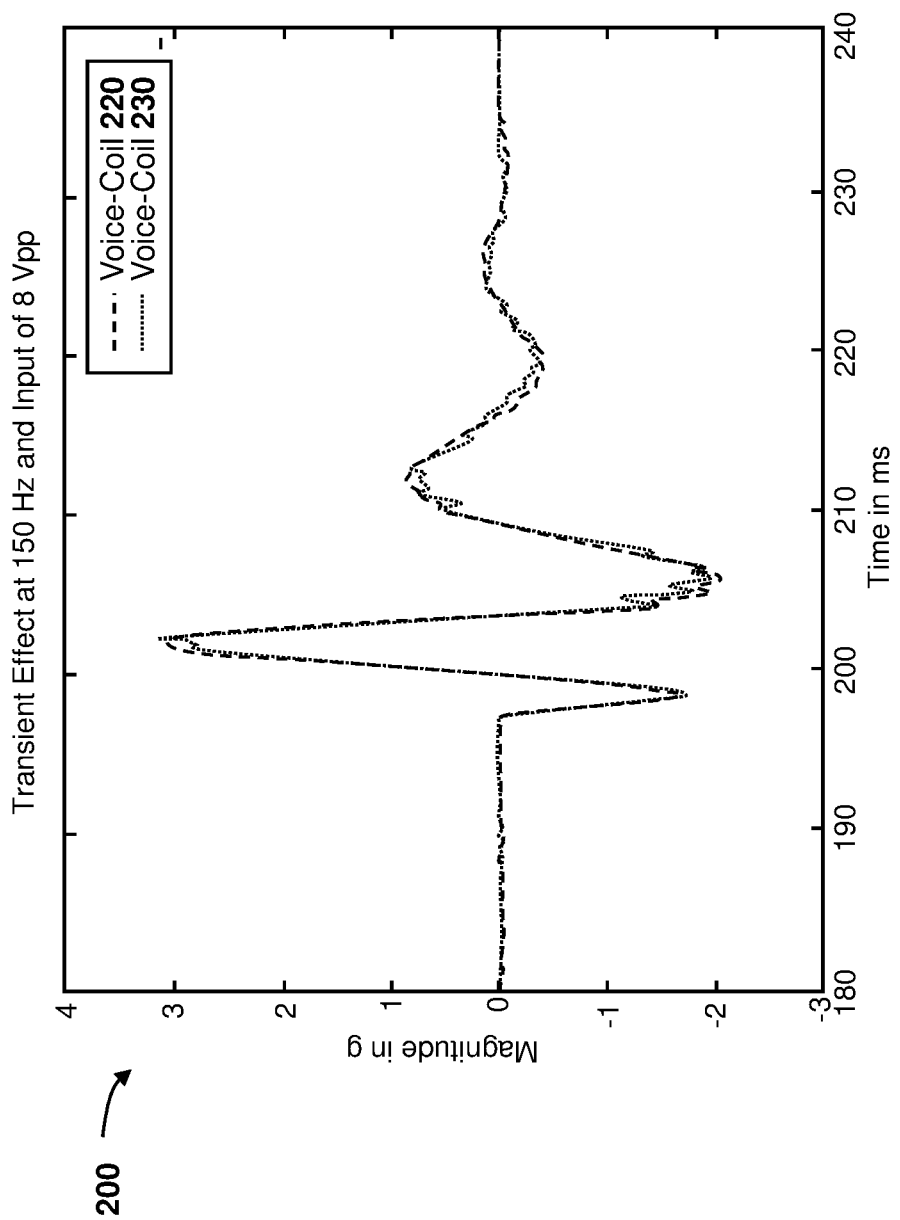
FIG. 2 is a graph of transient effect distortions found in two similar voice-coil actuator model outputs using a 100 gram load tested in a handheld form-factor prototype device with a different frequency to the example of FIG. 1.

For example, reference is now made to FIGS. 1 to 3, which show examples of actuator distortions. In particular, FIG. 1 shows a graph 100 of transient effect distortions found in two voice-coil actuator outputs using a 100 gram load tested in the same handheld prototype device. Plot 120 for a first voice-coil actuator shows different transient distortions than plot 130 for a second voice-coil actuator.

FIG. 2 shows output of the system used in the graph of FIG. 1, using a different input signal. In the example of FIG. 2, graph 200 shows that plot 220 for a first voice-coil has different transient distortions than plot 230 for a second voice-coil.

Figure 3A:
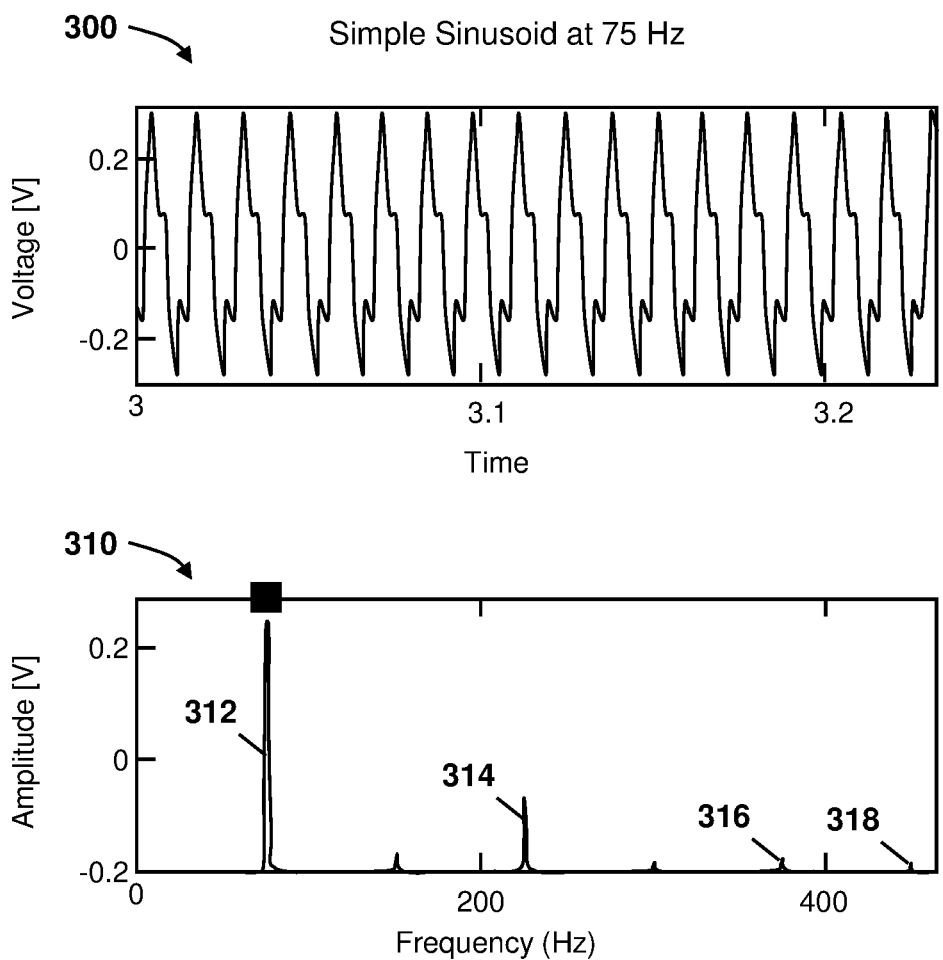
FIG. 3A is a graph showing continuous effect distortions found in different voice-coil actuator models for a simple sinusoid input at 75 Hz.

FIG. 3A shows continuous effect distortions found in different voice-coil actuator output for a simple sinusoid input at 75 Hz. For example, graph 300 shows how the sinusoidal wave is distorted at the output of the vibrotactile device. Graph 310 shows the primary harmonic 312 at 75 Hz, but also distortion harmonics 314, 316 and 318.

Figure 3B:
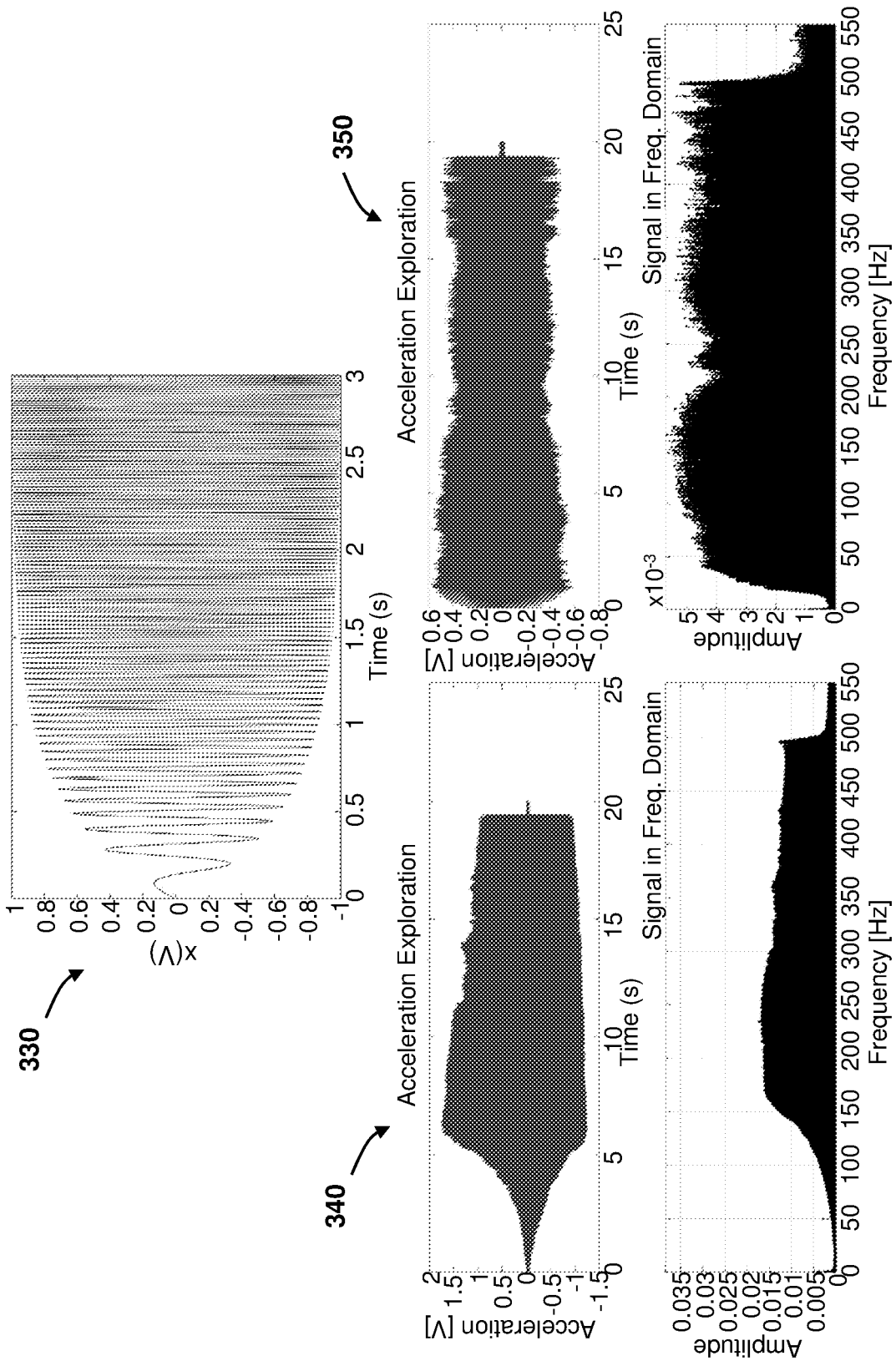
FIG. 3B is a graph showing a 20 second long chirp continuous effect logarithmically sweep from 0 Hz to 500 Hz with an amplitude variance from −1 V to 1 V; and the frequency response of two different voice coil actuators.

FIG. 3B shows continuous 20 second long input chirp effect 330 that is logarithmically sweep from 0 Hz to 500 Hz and its amplitude varies from −1 V to 1 V. Graph 340 shows the frequency response of a first voice-coil actuator and graph 350 shows the frequency response of a second voice-coil actuator.

Traditional approaches to reducing output distortions from haptic feedback devices tend to attempt to blindly reduce the distortions inherent in an actuator output. Conversely, in the embodiments of the present disclosure, perceptual measures capable of isolating perceptible distortions in a closed-loop control scheme are created, and thus direct an equalization mechanism to target such distortions. This provides various advantages.

For example, closed-loop control usually requires a high sampling and control rates from the overall system perspective to efficiently produce a corrected signal. In one embodiment, a controller capable of switching between correction mode (perceptual distortion) and no-correction mode in other circumstances (imperceptible distortion), is provided.

Further, in the reconstructed signal, blindly adapting all frequency components may also introduce undesirable harmonics. In one embodiment, the perceptual measures capable of isolating perceptible distortions in a closed-loop control scheme remove these undesirable harmonics.

Therefore, the embodiments of the present disclosure provide for a perceptual closed-loop control and equalization engine of haptic actuators that reduces or eliminates perceived distortions. The engine relies on perceptual measure to isolate perceptible distortions in the actuator output from those imperceptible ones. Then a control scheme directs the equalization mechanism to target such distortions. This in turn helps improve actuator performance in terms of feedback consistency and high quality output.

In particular, vibrotactile feedback is a proximal stimulation created by haptic actuators and obtained by the skin of the human consumer. A perceptually-driven closed-loop control and equalization system thus takes advantage of both vibration generation and human vibration perception knowledge.

In the embodiments described below, hardware components and software modules work together to provide for a perceptual closed-loop control and equalization engine of haptic actuators that reduce or eliminate perceived distortions. The overall system can be embedded in different electronic devices that provide haptic feedback.

Specifically, in some embodiments, the device is a desktop computer. In some embodiments, the device is portable (e.g., a laptop computer, tablet computer, or smartphone). In some embodiments, the device is a personal electronic device (e.g., a wearable electronic device, such as a watch). In some embodiments, the device is a touchpad or trackpad. In some embodiments, the device is a computer mouse or a virtual keyboard. In some embodiments, the device is any other device that uses haptic actuators.

The user's interaction with the user interface is improved by providing haptic effects in response to user's input. For example, when a user performs a swipe gesture on a touch-sensitive surface (e.g., touch-screen display of a handheld device, or trackpad), the electronic device with haptic feedback in the illustrative embodiment detects the gesture and produce a haptic effect in accordance with the determined gesture to inform the user that the action was successfully registered.

Single Haptic Actuator and Sensor

Reference is now made to FIG. 4, which shows one illustrative embodiment, and includes a haptic actuator 410 configured to output a haptic tactile effect, a sensor 412 configured to sense the output of the haptic actuator and generate a sensor signal 414, an amplifier 420 to drive the haptic actuator, a PCCE (Perceptual Close-loop Control and Equalization) engine 430, and a tactile feedback controller 440. In one embodiment, amplifier 420 may form part of controller 440, as illustrated in the example of FIG. 4. The PCCE engine 430 is configured to receive the sensor signal 414 from the sensor 412, receive a desired amplified vibrotactile signal 446, and produce an adapted playback vibrotactile signal 444, may also be referred to as an adapted signal, that is input to the controller 440, and in particular to an input buffer 445. The output from the controller 440 is provided, through amplifier 420 to actuator 410, which then displays or plays back the equalized final output tactile effect 450.

Specifically, in the embodiment of FIG. 4, haptic actuator 410 is used to display (output) the desired input signal 442. The haptic actuator 410 can be any sort of actuator, including for example, a piezoelectric actuator, an electric motor, an electromagnetic actuator, a voice coil, a shape memory alloy, an electroactive polymer, a solenoid, an eccentric rotating mass motor (ERM), or a linear resonant actuator (LRA), a low profile haptic actuator, a haptic tape, or a haptic output device configured to output an electrostatic effect, such as an Electrostatic Friction (ESF) actuator, among other options.

In some embodiments, haptic actuator 410 may comprise a plurality of heterogeneous actuators, for example a low profile haptic actuator, a piezoelectric actuator, and a LRA. Other options are possible.

The amplifier 420 stage generates a haptic or driving signal with suitable voltage requirements to activate the haptic display device, namely haptic actuator 410, and may receive input from an output buffer 443.

The sensor 412 records the haptic actuator 410 output and generates a sensor signal 414. The sensor 412 may comprise various types of sensors, including for example, a Hall Effect sensor, an accelerometer, a gyroscope, an optical sensor, such as a camera or infrared sensor, or any other type of sensor or combinations of sensors for detecting the output of the haptic actuator 410 and generating a sensor signal 414 corresponding to the output haptic effect. The haptic actuator 410 and the sensor 412 may be combined in some embodiments. In other embodiments, the haptic actuator 410 and the sensor 412 may be separate elements.

The controller 440 controls the selection of tactile output. In some embodiments, the controller 440 may be coupled with one or more actuator/sensor units and select one or more units and send the waveform to the selected unit/s. In some embodiments, the controller 440 coordinates tactile output requests that correspond to activation of a hardware actuator and tactile output requests that correspond to software events, and may also modify the tactile output waveform based on the output of the PCCE engine 430, as described below. Specifically, the controller 440 may utilize output buffer 443 for receiving and storing a desired input signal 442. Controller 440 may further include an input buffer 445 for receiving an adapted playback vibrotactile signal 444 from a PCCE engine 430. The controller can choose the signal from the output buffer to send, optionally through amplifier 420, to the haptic actuator 410. This may be done, for example, if the input buffer is empty, such as before the PCCE engine creates the adapted playback vibrotactile signal 444. The output buffer may also be used when the PCCE engine 430 detects no perceptible distortions in some cases.

In other cases, the contents of the input buffer may be used as the output to the haptic actuator 410, optionally through amplifier 420. Such signal may be sent directly through the amplifier 420 to the haptic actuator 410 in some embodiments, or may flow through the output buffer in other embodiments.

Specifically, the desired input signal 442 may be provided to output buffer 443, which may then provide a frame of the signal through amplifier 420 to produce a desired amplified vibrotactile signal 446. In one embodiment amplifier 420 is however optional, and the frame may be provided directly as a reference tactile signal.

Desired amplified vibrotactile signal 446, also referred to herein as a reference tactile signal, and the sensor signal 414 are both fed to the PCCE engine 430. In some embodiments, the PCCE engine 430, which may be a software and/or hardware module, comprises of three main sub-units, namely: a Perceptual Detection Probability Unit 460; a Spectral Similarity Unit 462; and an Adaptation and Equalization Unit 464. Each is described below.

Perceptual Detection Probability Unit

The Perceptual Detection Probability Unit 460 transforms input signals to perceptual representations, and hence isolates perceptual distortions in sensor signal 414. This may, in some cases, be done using nonlinear mapping that resembles human tactile perception.

In particular, neurophysiological studies and psychophysical evidence has identified four channels of mechanoreceptors in the glabrous skin of the human somatosensory periphery that mediate tactile sensation. The four channels, known as P, NP I, NP II, and NP III, work in conjunction for the perception of vibrations, and each has distinct responses to vibration stimuli that extend from 0.5 to greater than 500 Hz.

The necessary stimulus to provoke a response from any channel is defined as the detection threshold. The threshold amplitude is commonly expressed in terms of the displacement of the moving element of a vibrator. The four sensory channels partially overlap in their operating frequency ranges, making it likely that for supra-threshold stimuli, two or more channels are activated simultaneously.

Therefore, the perceptual sensitivity of vibrotactile stimuli is determined by a combined overall threshold-frequency characteristic of the four channels.

One model used to describe these displacement-frequency characteristics is provided with regard to equation 1 below.

$$DT(f) \approx 282.184(-2.653 + \log(f+200)^2) - 20 \quad (1)$$

In equation 1, DT is the displacement detection threshold for a frequency f. The displacement detection threshold can then be transformed to an acceleration detection threshold (AccT(t)) by a factor of the squared frequency as shown in equation 2.

$$AccT(f) = 4\pi^2 f^2 DT(f) \quad (2)$$

To distinguish between perceptual and imperceptible distortions in both desired amplified vibrotactile signal 446 (reference tactile signal) and sensor signal 414, the local standard deviation a may be passed from both signals through a nonlinear mapping function. The nonlinear mapping may be designed so that perceptual distortions are mapped to 1 and imperceptible distortions to 0, with a smooth transition in-between.

Practically, the human tactile sensitivity does not have a fixed threshold of vibration detection, but typically follows a U-shaped curve according to the four channels of mechanoreceptors in the glabrous skin of the human somatosensory periphery. Psychometric functions describing the detection probability of signals are used herein to model the data taken from psychophysical experiments. Generally, the psychometric function resembles a sigmoid shape, and the sensory threshold is usually defined at the level of 50% of detection probability. A commonly adopted psychometric function takes the form of a cumulative normal distribution function, shown in equation 3.

$$p(\sigma) = \frac{1}{\sqrt{2\pi\theta}} \int_{-\infty}^{\sigma} \exp\left[-\frac{(x - \tau_\sigma)^2}{2\theta_\sigma^2}\right] d\sigma \quad (3)$$

Where p is the detection probability density, a is the standard deviation of the vibrotactile stimulus that represent the signal strength. $\tau_\sigma$ is defined as the acceleration threshold of the standard deviation values. In equation 3 the threshold values are calculated based on a displacement threshold measurement assuming a pure sinusoidal stimulus. To convert it to a signal strength threshold measured using the standard deviation of the signal, it is noted that signal amplitude scales with both contrast and mean signal values, and there is a $\sqrt{2}$ factor between the amplitude and standard deviation of a sinusoidal signal. $\theta_\sigma$ is the standard deviation of the normal distribution that controls the slope of detection probability variation. The ratio between $\tau_\sigma$ and $\theta_\sigma$ is roughly a constant k in accordance with:

$$\tau_\sigma(f) = \frac{AccDT(f)}{\sqrt{2}} \text{ and } \theta_\sigma = \frac{\tau_\sigma(f)}{k}$$

Spectral Similarity Unit

The Spectral Similarity Unit 462 compares the perceptual representations of the reference tactile signal (desired amplified vibrotactile signal 446) and sensor signal 414 and yields a number between 0 and 1 that quantifies the degree of perceptual distortions found in sensor signal.

Specifically, the Spectral Similarity Unit 462 determines the degree of similarity between reference (desired amplified vibrotactile signal 446) and sensor detection probability densities that were obtained at the Perceptual Detection Probability Unit 460. This Spectral Similarity Unit 462 outputs a number between 0 and 1, with 0 indicating total difference and 1 indicating complete similarity between the two inputs.

In one embodiment, the desired amplified vibrotactile signal 446 and sensor signal 414 are first divided into N number of segments with a fixed number of samples. Each segment is then analyzed using some form of spectral analysis technique. Such technique may include, but is not limited to, a Short-Time Fourier Transform.

The detection probability density in equation 4 below is computed for each segment and employed to obtain the Spectral Similarity measure defined as:

$$SS(X, Y) = \frac{p(\sigma_X)p(\sigma_Y)}{p(\sigma_X)^2} \quad (2)$$

In equation 4, SS is the Spectral Similarity, and X and Y are the frequency transform of the desired amplified vibrotactile signal 446 and the sensor signal 414, and $\sigma_x$ and $\sigma_y$ are the local standard deviation of the desired amplified vibrotactile signal 446 and the sensor signal 414 respectively.

Adaptation and Equalization (EQ) Unit

The Adaptation and Equalization Unit 464 is used to flatten the frequency response of the actuator to match a target response, so that the system's net frequency response has an equal response to all frequencies. The adaptation and/or alteration of input signal is controlled based on the perceptual similarity of each signal's segment obtained using previous units. The equalization filters can be designed according to most commonly used equalization techniques such as parametric and/or graphic equalizers.

Specifically, the frequency response of an electronic device with haptic-enabled feedback can be adequately described using a linear-time invariant system. The goal of the frequency response is to characterize the system behavior to predefined inputs considering different loading conditions.

Figure 5:
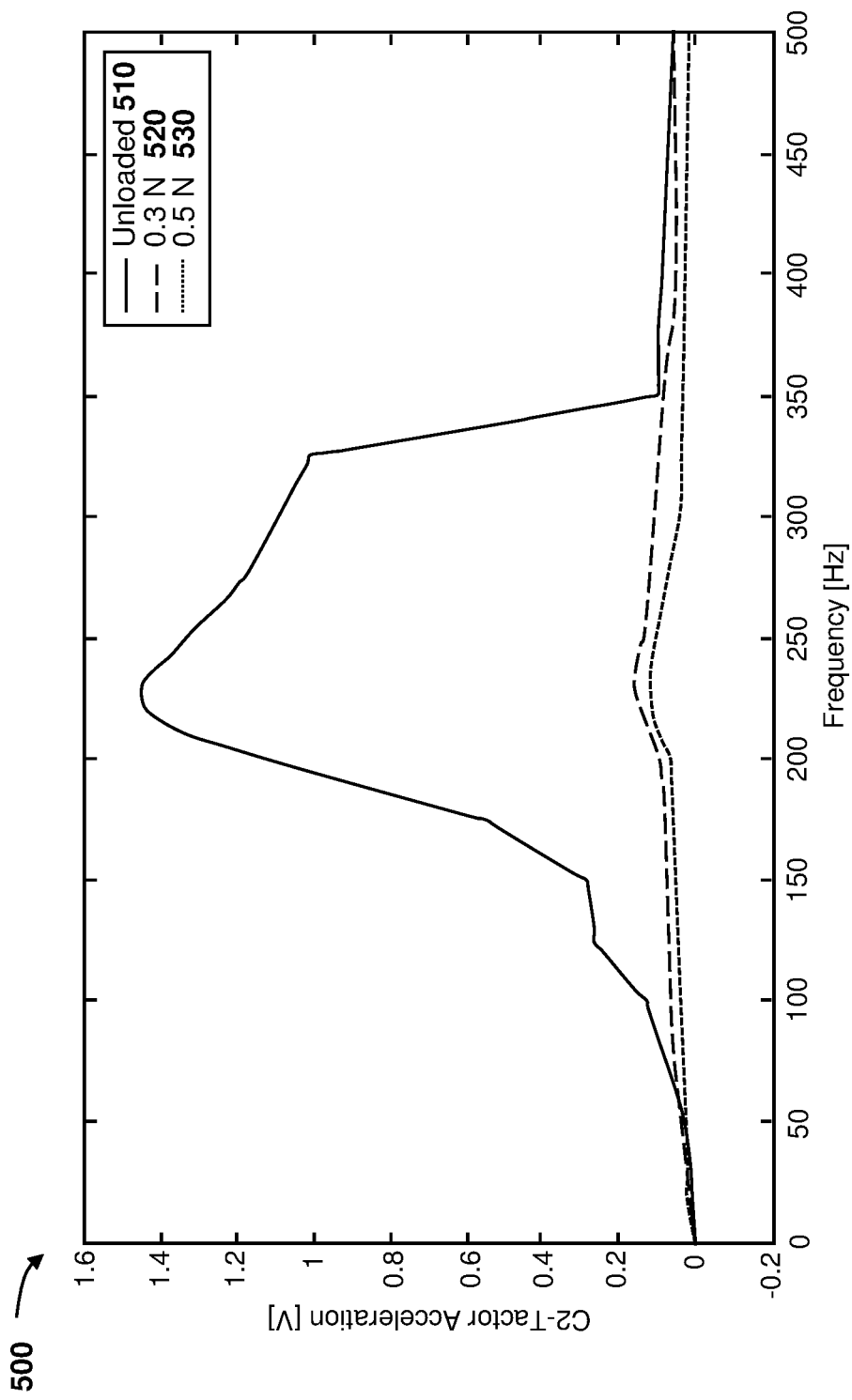
FIG. 5 is a graph of a frequency response of a first voice-coil actuator under different loading conditions.
Figure 6:
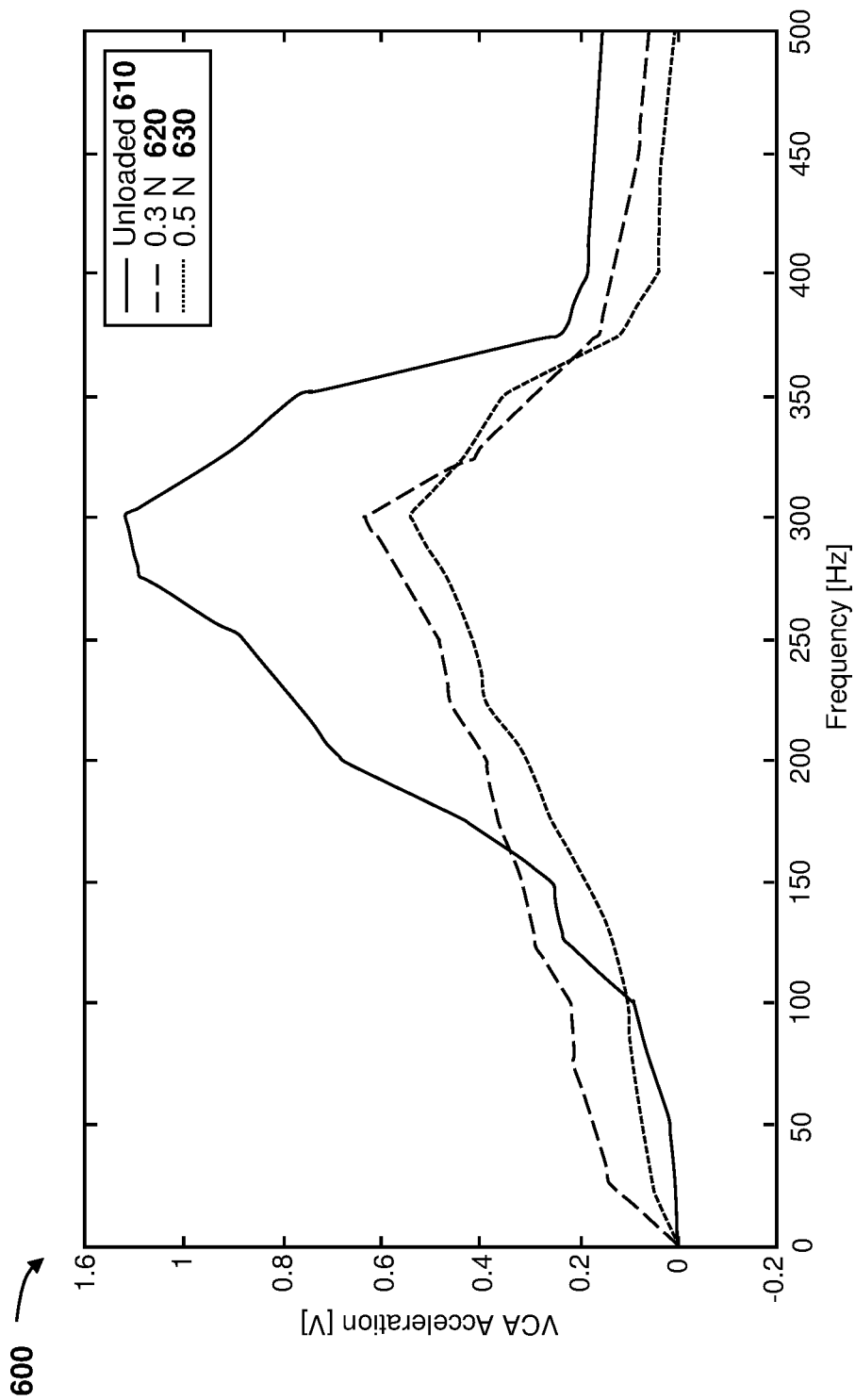
FIG. 6 is a graph of a frequency response of a second voice-coil actuator under different loading conditions.

Examples of the frequency response of two voice-coil actuators under different loading conditions are given in FIGS. 5 and 6. In the examples of FIGS. 5 and 6, the input to the system comprises sinusoidal signals with varying frequencies from 25 Hz to 500 Hz.

In particular, as seen in FIG. 5, a graph 500 includes a frequency response of a first electronic device, showing the response in an unloaded state 510, with a 0.3N load 520 and with a 0.5N load 530.

Further, as seen in FIG. 6, a graph 600 includes a frequency response of a second electronic device, showing the response in an unloaded state 610, with a 0.3N load 620 and with a 0.5N load 630.

An equalization filter can be designed with adjustable gain, bandwidth, and central frequency to target multiple frequency regions in the vibrotactile signal. Consider a general system that has an input x and an output y with the system function y=f(x). If the system function is known and invertible, one can constitute an identity system by cascading f(x) with its inverse g(x), where g(x)=1/f(x). This allows the complete control of the system output y without any effects of the system dynamics.

Additionally, the equalization filter can be modulated using the preceding Spectral Similarity Unit 462 to equalize frequency bands with highest perceptual distortions. The adaptation filter in this embodiment may, for example, be described using equation 5.

$$R(w)=P(w) \cdot G(w) \tag{5}$$

In equation 5, P is a local band-pass filter designed based on the frequency band identified by the Spectral Similarity measure in equation 4. For example, in one case the band-pass filter may be a quadratic-Gaussian filter. However, other options are possible.

Figure 7:
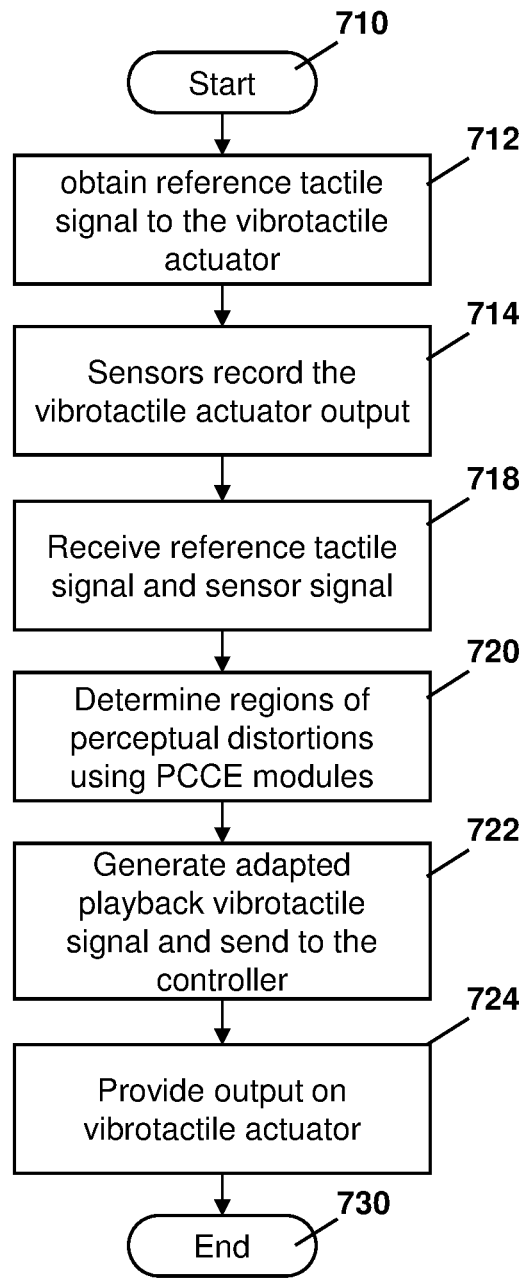
FIG. 7 is a process diagram showing a process for removing or reducing perceptual distortions from a haptic actuator display.

Based on the above, a method at an electronic device is described with regards to FIG. 7. In particular, in the embodiment of FIG. 7, the process starts at block 710 and proceeds to block 712 in which a desired amplified vibrotactile signal, also referred to as a reference tactile signal, is obtained and sent to the vibrotactile actuator.

In particular, when the system is activated, a short logarithmically sine sweep may be played as a starting input signal to estimate the actuator frequency response and/or transfer function.

From block 712, the process then proceeds to block 714 in which a sensor associated with the vibrotactile actuator records the vibrotactile actuator output. For example, the sweep may be recorded with an internal sensor in order to obtain the impulse and frequency response of the actuator. The controller uses the impulse response to obtain the delay caused by the recorded chain, which is used to synchronize the playback and vibrotactile signal with the sensor recording signal.

The process then proceeds to block 718 in which a PCCE engine receives both the desired amplified vibrotactile signal, also referred to as a reference tactile signal, and the sensor signal found from the vibrotactile actuator output. The PCCE engine may then utilized the modules as described with regard to FIG. 4 in order to determine regions of perceptual distortions, followed by adjusting and controlling the equalization filter to minimize the difference between the measured and target response, as shown at block 720.

From block 720, the process proceeds to block 722 in which an adapted playback vibrotactile signal is generated and is sent to the controller. Since this process is operated in a frame-by-frame basis, two buffers are used to store previous input and output signal samples. In one embodiment the adapted playback vibrotactile signal is sent to an input buffer within the controller. However, other options are possible. In some cases, the controller can adjust the input/output rate and the input/output buffer size to optimize the real-time adaptation and playback performance.

Based on the adapted playback vibrotactile signal sent to the controller, the output from the controller may be provided to the vibrotactile actuator as shown at block 724. In some embodiments the output from the controller may be passed through an amplifier as for example shown in the embodiment of FIG. 4.

The process then proceeds to block 730 and ends.

The embodiment of FIG. 7 may, for example, be used on a portable device, such as smart phone, tablet and/or laptop, which is designed to enable users to interact with user interface elements, such as virtual buttons or virtual keyboard. When the user touches the touch screen of the device at the location of the button, an application renders a sharp clean haptic feedback. However, actuator distortions result in unpleasant user experience and may hinder adoption of the technology. The use of the embodiments of the present disclosure ensure the sharp, clean haptic feedback provided by the application is displayed to the user by correcting these actuator distortions.

Specifically, haptics improves the usability of devices and provides an additional layer of entertainment and sensory immersion to users. This may lead to a proliferation of vibrotactile applications and use cases in many industrial markets; such as automotive, gaming, wearable, handheld devices, and AR/VR. Unlike the other sensory modalities, the haptic sensation may be perceived over the whole body due to the mechanoreceptors distributed all over the body. Thus, a haptic interface is designed to be adequate to the body site that the interface stimulates and to the purpose of the stimulation. This unique property of haptic interaction has brought a variety of haptic interfaces with different actuators and associated haptic rendering methods.

The above embodiments provide for the delivery of high quality haptic effects when designing haptic-enabled interfaces with various actuator technologies.

By using perceptually driven control and equalization techniques, a reduction or minimization of inherent actuator distortions that alter the actuator output compared to its corresponding input may be achieved.

While prior approaches developed methods to blindly reduce such distortions, the embodiments of the present disclosure seek to employ vibration perception knowledge by designing a perceptual measure that is capable of isolating perceivable distortions, and hence guide the control equalization scheme. This may allow for several advantages. First, a closed-loop control usually requires high sampling and/or control rates to efficiently produce the corrected haptic output signal. It may therefore be beneficial to have a guided control method that is able to switch in some cases between correction mode (perceptual distortions) and no-correction mode in other circumstances (in case of imperceptible distortions). Second, perceptually equalizing distortions produce a perceptually transparent rendering of tactile sensations across different body parts and devices.

Multi-Channel Equalization

In one embodiment, a plurality of haptic actuator devices may exist in a system. In this case, some of the haptic actuator devices, in addition to having distortions in the output, as described above, may interfere or cause "crosstalk" with each other.

Figure 8:
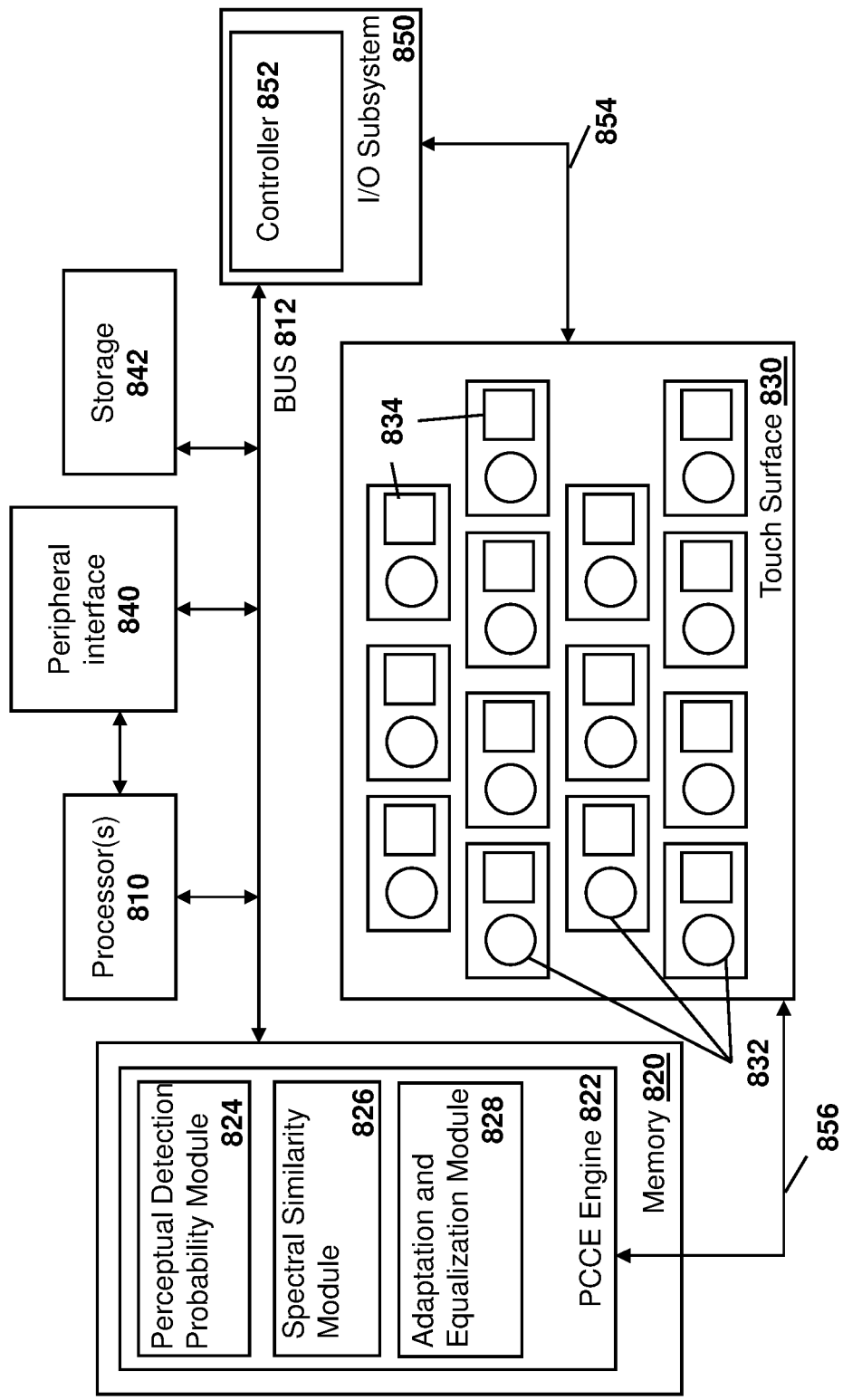
FIG. 8 is a block diagram of a device with multiple haptic actuators and sensors for perceptual distortion correction in a haptic display.

For example, a system having a plurality of haptic actuator devices is described with regards to FIG. 8. However, the embodiment of FIG. 8 is merely one example of a system, and in other cases, other computing devices could be used with the embodiments of the present disclosure.

In the embodiment of FIG. 8, a system comprises a haptic-enabled computing device having a processor 810 interfaced with other hardware via bus 812. The computing device may be any type of device, including for example, a mobile phone or laptop. A memory 820, which can comprise any suitable tangible computer-readable medium such as RAM, ROM, EEPROM, or the like, embodies similar software components to those described with regards to FIG. 4 that configure operation of the haptic-enabled device. In particular, a PCCE Engine 822 may be stored in memory 820 and executed by processor 810.

In accordance with one embodiment, PCCE Engine 822 includes a Perceptual Detection Probability Module 824, a Spectral Similarity Module 826, and an Adaptation and Equalization Module 828, have similar functionality to the modules described with regards to the embodiment of FIG. 4.

The system further includes a touch surface 830 which, in the example embodiment of FIG. 8, is integrated with the device. The touch surface 830 represents any surface that is configured to sense touch input of a user and display interface elements with which a user can interact, such as for example, one or more buttons. An array of vibrotactile actuators 832 and sensors 834 are coupled to the touch surface to display desired tactile feedback that augment touch user interaction.

While the embodiment of FIG. 8 provides a sensor for each vibrotactile actuator, in other cases there may be more actuators than sensors, or more sensor than actuators, in a touch surface 830.

The computing device further includes one or more peripheral interface components 840, and additional storage 842. An I/O subsystem 850 embodies the controller 852. The reference signal 854, may also be referred to as a reference tactile signal, is sent from the tactile feedback controller 852, which is meant to reflect the desired tactile output effect. This tactile feedback controller provides the reference signal 854 to one or more amplifier to activate one or more actuators. The controller 852 collects sensor signals and communicate with the processor and memory modules for signal equalization as described below.

In embodiments having multiple haptic actuator devices, the system described above with regards to FIGS. 4 to 7 can be extended from a single input, single output system to a multiple input, multiple output (MIMO) linear time-invariant system. Specifically, sensors 834 associated with touch surface 830 may provide separated sensor signals 856 to PCCE Engine 822. Separated sensor signals 856 may include a plurality of sensor signals from all or a subset of the sensors 834 associated with touch surface 830.

One complication of multiple actuators simultaneously displaying vibrations alongside with multiple sensor measurements will typically implies cross-coupling effects between multiple channels. Consequently, the observed output $y_i$ may get corrupted by the superposition of delayed and attenuated wave propagation.

A mathematical description of this problem to identify a multi-channel system and recover the inputs from the outputs, is as follows. Assume there to be M measured signals $x_j(n)$, $j \in [1, 2, \ldots, M]$ which are mixtures of N independent source signals $s_i(n)$, $i \in [1,2, \ldots, N]$. In one case, let N=M.

Based on this, $$x(n)=[x_1(n)x_2(n) \ldots x_M(n)]s(n)=[s_1(n)s_2(n) \ldots s_N(n)] \quad (5)$$

From this, $x(n)=f(s(n))$, where f is the mixed function of equation 6 below.

$$x_j(n) = \sum_{j=1}^{M} h_{ij} * s_i(n), i = 1, \ldots, N \quad (6)$$

In equation 6, $h_{ij}$ is the cross-coupled effect when $i \neq j$, $h_{ij}=I$ when $i=j$.

A desired N output $y(n)=[y_1(n)\ y_2(n) \ldots y_N(n)]$ may be provided by $y(n)=g(x(n))$, where g is the separating function $g(f(s(n)))$.

Figure 9:
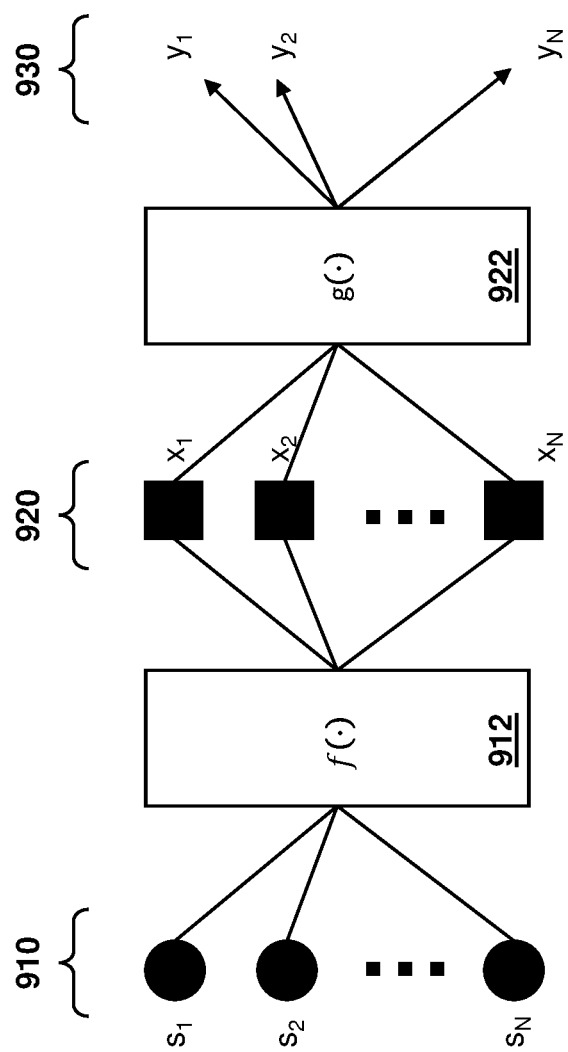
FIG. 9 is a block diagram showing multi-channel actuator and sensor signal equalization.

One option is to define $g(\blacksquare)=f^{-1}(\blacksquare)$, which is illustrated with regards to FIG. 9.

In particular, in the embodiment of FIG. 9, the source signals 910 are provided to a mixing function block 912, producing measured signals 920. These measured signals are then provided to the separating function 922 to produce output signals 930.

Working in matrix format, the actuator output Y can be defined in terms of the sensor signals X and the frequency response of the system H in accordance with equation 7 below.

$$Y(\omega) = H(\omega)X(\omega) \quad (7)$$

$$\begin{bmatrix} Y_1 \\ \vdots \\ Y_M \end{bmatrix} = \begin{bmatrix} H_{11} & H_{12} & H_{13} & \ldots & H_{1N} \\ \vdots & \vdots & \vdots & \ddots & \vdots \\ H_{M1} & H_{M2} & H_{m3} & \ldots & H_{MN} \end{bmatrix} \begin{bmatrix} X_1 \\ \vdots \\ X_N \end{bmatrix}$$

Equation 7 provides that at each output $Y_j$, the vibration contribution from a given input is the convolution of that input $X_i$ with the frequency response $H_{ij}$ from input i to output j. Then, to obtain the intended vibrotactile signal, sensor signals are fed into the adaptation filter, as for example described with regard to equation 5 above, to compute the driving signals sent to all actuators. All actuators where vibration must be controlled or cancelled are thus driven simultaneously.

This is for example shown with equation 8:

$$X_{adapted}(\omega)=H^\dagger P(\omega)Y(\omega) \quad (8)$$

In equation 8, $H^\dagger$ is the pseudo-inverse of H, which can be computed using least-squares approximation in the frequency domain using singular value decomposition in one embodiment. P is the band-pass filter described above in equation 5.

Figure 10:
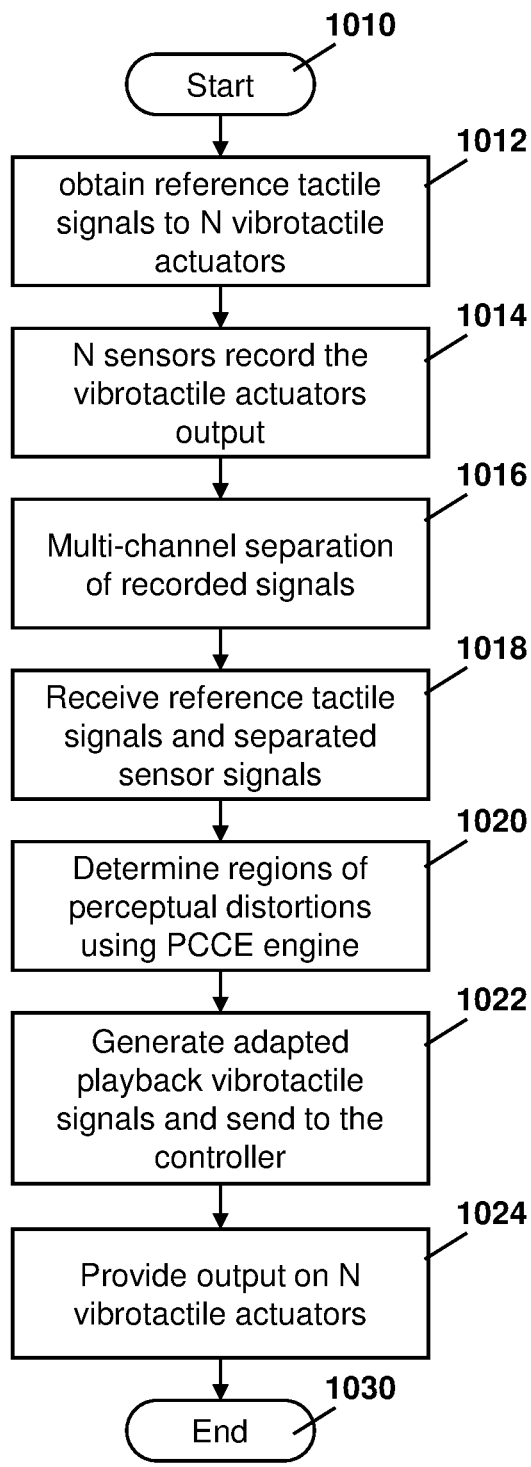
FIG. 10 is a process diagram showing a process for removing or reducing perceptual distortions from a multi-channel haptic actuator display.

A method for utilizing the embodiments of FIGS. 8 and 9 is provided with regard to FIG. 10. In particular, the embodiment of FIG. 10 starts at block 1010 and proceeds to block 1012 in which desired amplified vibrotactile signals, also referred to as reference tactile signals, may be obtained and sent to N vibrotactile actuators.

From block 1012, the process proceeds to block 1014 in which the sensors associated with the actuators record the actuator output.

The process then proceeds to block 1016 in which a multi-channel separation of recorded signals may be performed to create separated sensor signals.

Based on the results from block 1016, the desired amplified vibrotactile signals (reference tactile signals) and separated sensor signals are thus received at block 1018.

Utilizing the desired amplified vibrotactile signals and separated sensor signals, the regions of perceptual distortions may be determined at block 1020 using the PCCE modules, as for example described with regard to the embodiment of FIG. 7.

Based on the results from the PCCE modules, adapted playback vibrotactile signals may be generated and sent to the controller, as shown at block 1022.

The process may then proceed to block 1024 in which the output from the controller to the N vibrotactile actuators is provided. This may in some cases utilize an amplifier.

From block 1024, the process proceeds to block 1030 and ends.

Therefore, in the embodiments of FIGS. 8 to 10, the device may comprise multiple actuator/sensor units mounted underneath a wide touch surface in order to provide companion haptic feedbacks for various user interaction gestures. For example, such gestures may include scroll up/down, drag/drop, swipe horizontally/vertically, and button clicks, among others. As such, a system with multiple actuator units designed to be simultaneously activated requires extra considerations to obtain clean output signals. This configuration, however, provides more accurate and consistent haptic feedback since the actuators output are controlled to follow a desired haptic effect.

Based on the above, perceptual measures capable of isolating perceptible distortions in a closed-loop control scheme are created, and thus guide the equalization mechanism to target such distortions.

A growing number of use cases are established and emerging for tactile media contents as a standard feature in various industrial markets. For example, wearable devices are particularly well suited to offer personal, high-quality and reliable haptic experiences to users. Most wearable interfaces rely on presenting vibrotactile stimulation to the wearer via varying types of motor and actuation technology.

A large majority of devices use a single actuator, but newer commercial offerings operate with two or more actuators in order to provide a refined experience. This in turn calls for advanced methods like those proposed herein that ensure the quality and consistency of tactile effect delivery to the human wearer.

Automobiles have become a new platform for haptic innovation as Original Equipment Manufacturers (OEM) and Tier suppliers seek to differentiate through advanced industrial design. Cockpit control design is transitioning from electromechanical switches and potentiometers to touchscreens, touchpads, and touch surfaces, which can lead to both cost savings and new, more ergonomic Human-Machine-Interface (HMI) design. Haptics will play an increasing role in providing timely and salient feedback to drivers.

Haptic design that presents important information at the right time and to specific parts of the body, by incorporating tactile perceptual methods as described herein, will allow drivers to feel confident in the operation of the vehicle while keeping eyes on the road. Haptics will also allow drivers to explore a touch surface and feel the locations of controls before activating their functions.

All of the aforementioned use cases and scenarios are only a small portion of examples to illustrate the anticipated benefits of the methods, devices and systems herein in other potential markets.

The above computing devices or computers may be implemented using any computing device. One simplified diagram of a computing device is shown with regard to FIG. 11. The computing device of FIG. 11 could be any fixed or mobile computing device.

Figure 11:
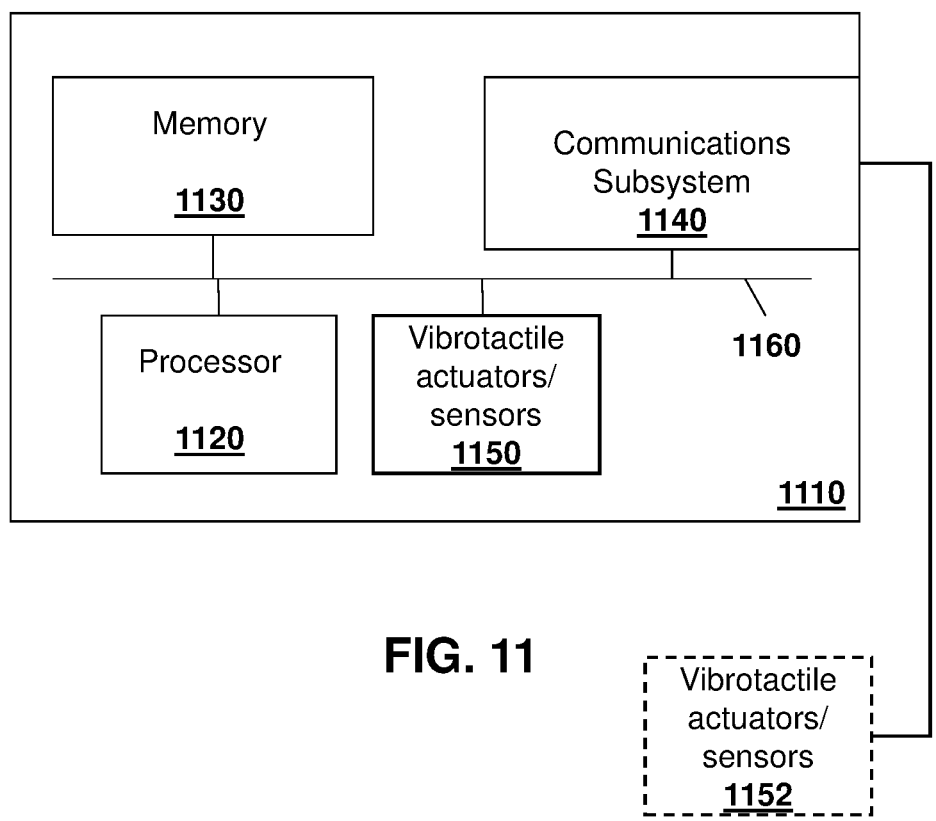
FIG. 11 is a block diagram of a simplified computing device capable of being used with the embodiments of the present disclosure.

In FIG. 11, device 1110 includes a processor 1120 configured to execute programmable logic, which may be stored, along with data, on device 1110, and shown in the example of FIG. 11 as memory 1130. Memory 1130 can be any tangible, non-transitory computer readable storage medium which stores instruction code that, when executed by processor 1120 cause device 1110 to perform the methods of the present disclosure. The computer readable storage medium may be a tangible or in transitory/non-transitory medium. Typically, storage mediums can include any or some combination of the following: a semiconductor memory device such as a dynamic or static random access memory (a DRAM or SRAM), an erasable and programmable read-only memory (EPROM), an electrically erasable and programmable read-only memory (EEPROM) and flash memory; a magnetic disk such as a fixed, floppy and removable disk; another magnetic medium including tape; an optical medium such as a compact disk (CD) or a digital video disk (DVD); or another type of storage device. Note that the instructions discussed above can be provided on one computer-readable or machine-readable storage medium, or alternatively, can be provided on multiple computer-readable or machine-readable storage media distributed in a large system having possibly a plurality of nodes. Such computer-readable or machine-readable storage medium or media is (are) considered to be part of an article (or article of manufacture). An article or article of manufacture can refer to any manufactured single component or multiple components.

Alternatively, or in addition to memory 1130, device 1010 may access data or programmable logic from an external storage medium, for example through a communications subsystem 1140. Communications subsystem 1140 allows device 1110 to communicate with other devices or with peripherals and may vary based on the type of communication being performed. Further, communications subsystem 1130 may comprise a plurality of communications technologies, including any wired or wireless communications technology. In some embodiments, communications subsystem 1140 is an optional component.

In the embodiment of FIG. 11, one or more vibrotactile actuators and one or more sensors may be internal to the device, as shown with module 1150, or may be external to the device and communicate with the device using wired or wireless communications, for example using communications subsystem 1140, as shown with module 1152.

Communications between the various elements of device 1110 may be through an internal bus 1160 in one embodiment. However, other forms of communication are possible.

The embodiments described herein are examples of structures, systems or methods having elements corresponding to elements of the techniques of this application. This written description may enable those skilled in the art to make and use embodiments having alternative elements that likewise correspond to the elements of the techniques of this application. The intended scope of the techniques of this application thus includes other structures, systems or methods that do not differ from the techniques of this application as described herein, and further includes other structures, systems or methods with insubstantial differences from the techniques of this application as described herein.

While operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be employed. Moreover, the separation of various system components in the implementation descried above should not be understood as requiring such separation in all implementations, and it should be understood that the described program components and systems can generally be integrated together in a single software product or packaged into multiple software products.

Also, techniques, systems, subsystems, and methods described and illustrated in the various implementations as discrete or separate may be combined or integrated with other systems, modules, techniques, or methods. Other items shown or discussed as coupled or directly coupled or communicating with each other may be indirectly coupled or communicating through some interface, device, or intermediate component, whether electrically, mechanically, or otherwise. Other examples of changes, substitutions, and alterations are ascertainable by one skilled in the art and may be made.

While the above detailed description has shown, described, and pointed out the fundamental novel features of the disclosure as applied to various implementations, it will be understood that various omissions, substitutions, and changes in the form and details of the system illustrated may be made by those skilled in the art. In addition, the order of method steps are not implied by the order they appear in the claims.

In the foregoing description, numerous details are set forth to provide an understanding of the subject disclosed herein. However, implementations may be practiced without some of these details. Other implementations may include modifications and variations from the details discussed above. It is intended that the present disclosure cover such modifications and variations.

In particular, example clauses may include:

AA. A method at a device to correct a haptic output display, the method comprising: sending, at the device, reference tactile signals to at least two haptic actuators; recording, using sensors associated with the at least two haptic actuators, output signals from the at least two haptic actuators; performing multi-channel separation of the output signals to create separated output signals; providing the reference tactile signals and the separated output signals to an engine at the device; determining, using the engine, regions of perceptual distortion from the output signal and the reference tactile signal; generating, at the device, adapted signals to reduce and equalize perceptual distortion in the regions of perceptual distortion; and providing the adapted signals to the at least two haptic actuators.

BB. The method of clause AA, wherein the generating the adapted signals is done at a tactile feedback controller which uses the reference tactile signals and separated outputs from the engine to generate the adapted signals.

CC. The method of clause BB, wherein the generating comprises providing the reference tactile signals as the adapted signals when the engine detects no perceptible distortions.

DD. The method of clause AA, wherein the engine comprises a first unit to transform each reference tactile signal from the reference tactile signals as well as separated signals into perceptual representations.

EE. The method of clause AA, wherein the multi-channel separation uses:

$$Y(\omega) = H(\omega)X(\omega)$$

$$\begin{bmatrix} Y_1 \\ \vdots \\ Y_M \end{bmatrix} = \begin{bmatrix} H_{11} & H_{12} & H_{13} & \cdots & H_{1N} \\ \vdots & \vdots & \vdots & \ddots & \vdots \\ H_{M1} & H_{M2} & H_{m3} & \cdots & H_{MN} \end{bmatrix} \begin{bmatrix} X_1 \\ \vdots \\ X_N \end{bmatrix}$$

where: Y is the actuator output Y; X is the output signals; and H if the frequency response of the system.

FF. The method of clause DD, wherein the engine further includes a second unit to determine a degree of similarity between the perceptual representations of reference tactile signals and the separated output signals obtained from the first unit.

GG. The method of clause FF, wherein the engine further includes a third unit to adjust an adaptation filter to target frequency bands with a threshold perceptual distortion level in the output signal.

HH. The method of clause GG, wherein adjustment of adaptation filter comprises adjusting a band-pass filter targeted at perceptual distortions over the threshold perceptual distortion level.

II. The method of clause AA, wherein the at least two haptic actuators are vibrotactile actuators.

JJ. A device configured to correct a haptic output display, the device comprising: a processor; at least two haptic actuators; and sensors associated with the at least two haptic actuators; wherein the device is configured to: send reference tactile signals to the at least two haptic actuators; record, using the sensors associated with the at least two haptic actuators, output signals from the at least two haptic actuators; perform multi-channel separation of the output signals to create separated output signals; provide the reference tactile signals and the separated output signals to an engine at the device; determine, using the engine, regions of perceptual distortion from the output signal and the reference tactile signal; generate, at the computing device, adapted signals to reduce and equalize perceptual distortion in the regions of perceptual distortion; and provide the adapted signals to the at least two haptic actuators.

KK. The device of clause JJ, wherein the device is configured to generate the adapted signals at a tactile feedback controller which uses the reference tactile signals and separated outputs from the engine to generate the adapted signals.

LL. The device of clause KK, wherein the device is configured to generate by providing the reference tactile signals as the adapted signals when the engine detects no perceptible distortions.

MM. The device of clause JJ, wherein the engine comprises a first unit to transform each reference tactile signal from the reference tactile signals as well separated signals into perceptual representations.

NN. The device of clause JJ, wherein the multi-channel separation uses:

$$Y(\omega) = H(\omega)X(\omega)$$

$$\begin{bmatrix} Y_1 \\ \vdots \\ Y_M \end{bmatrix} = \begin{bmatrix} H_{11} & H_{12} & H_{13} & \cdots & H_{1N} \\ \vdots & \vdots & \vdots & \ddots & \vdots \\ H_{M1} & H_{M2} & H_{m3} & \cdots & H_{MN} \end{bmatrix} \begin{bmatrix} X_1 \\ \vdots \\ X_N \end{bmatrix}$$

where: Y is the actuator output Y; X is the output signals; and H if the frequency response of the system.

OO. The device of clause MM, wherein the engine further includes a second unit to determine a degree of similarity between the perceptual representations of reference tactile signals and the separated output signals obtained from the first unit.

PP. The device of clause OO, wherein the engine further includes a third unit to adjust an adaptation filter to target frequency bands with a threshold perceptual distortion level in the output signal.

QQ. The device of clause PP, wherein adjustment of adaptation filter comprises adjusting a band-pass filter targeted at perceptual distortions over the threshold perceptual distortion level.

RR. The device of clause QQ, wherein the at least two haptic actuators are vibrotactile actuators.

SS. A non-transitory computer readable medium for storing instruction code, which, when executed by a processor of a device cause the device to: send reference tactile signals to the at least two haptic actuators; record, using the sensors associated with the at least two haptic actuators, output signals from the at least two haptic actuators; perform multi-channel separation of the output signals to create separated output signals; provide the reference tactile signals and the separated output signals to an engine at the device; determine, using the engine, regions of perceptual distortion from the output signal and the reference tactile signal; generate, at the computing device, adapted signals to reduce and equalize perceptual distortion in the regions of perceptual distortion; and provide the adapted signals to the at least two haptic actuators.

The invention claimed is:

1. A method for correcting a haptic output, the method comprising:
    obtaining, at a device, a reference tactile signal to a haptic actuator;
    recording, using a sensor associated with the haptic actuator, an output signal from the haptic actuator;
    providing the reference tactile signal and the output signal to an engine at the device;
    determining frequency regions of perceptual distortion from the output signal and the reference tactile signal;
    generating an adapted signal to reduce and equalize the perceptual distortion in the frequency regions of the perceptual distortion; and
    providing the adapted signal to the haptic actuator.

2. The method of claim 1, wherein the providing the adapted signal comprises:
    sending the adapted signal from the engine to an input buffer of a controller; and
    choosing, at the controller, the adapted signal from the input buffer to provide to the haptic actuator.

3. The method of claim 2, wherein the generating comprises providing the reference tactile signal as the adapted signal when the engine detects no perceptible distortions.

4. The method of claim 1, further comprising transforming the reference tactile signal and the output signal into perceptual representations at a first unit of the engine.

5. The method of claim 4, wherein a perceptual representation is in a form:

$$p(\sigma) = \frac{1}{\sqrt{2\pi}\theta_\sigma} \int_{-\infty}^{\sigma} \exp\left[-\frac{(x-\tau_\sigma)^2}{2\theta_\sigma^2}\right] d\sigma$$

where:
    p is a detection probability density;
    $\sigma$ is a standard deviation of a vibrotactile stimulus that represents signal strength;
    $\tau_\sigma$ is an acceleration threshold of the standard deviation; and
    $\theta_\sigma$ is the standard deviation of normal distribution that controls a slope of detection probability variation.

6. The method of claim 5, wherein $$\tau_\sigma(f) = \frac{AccDT(f)}{\sqrt{2}} \text{ and}$$

$$\theta_\sigma = \frac{\tau_\sigma(f)}{k} \text{ where}$$

$$AccDT(f) = 4\pi^2 f^2 DT(f) \text{ and}$$

$$DT(f) \approx 282.184(-2.653 + \log(f+200)^2) - 20.$$

7. The method of claim 4, further comprising determining a degree of similarity between the perceptual representations of the reference tactile signal and the output signal obtained from the first unit at a second unit of the engine.

8. The method of claim 7, wherein the degree of similarity is determined using:

$$SS(X, Y) = \frac{p(\sigma_X)p(\sigma_Y)}{p(\sigma_X)^2}$$

where:
    SS is a spectral similarity value showing the degree of similarity;
    X and Y are a frequency transform of the tactile reference signal and the output signal; and
    $\sigma_X$ and $\sigma_Y$ are a local standard deviation of the tactile reference signal and the output signal respectively.

9. The method of claim 7, further comprising adjusting an adaptation filter to target frequency bands with a threshold perceptual distortion level in the output signal at a third unit of the engine.

10. The method of claim 9, wherein adjustment of adaptation filter comprises adjusting a band-pass filter targeted at perceptual distortions over the threshold perceptual distortion level.

11. A device for correcting a haptic output, the device comprising:
    a processor;
    a haptic actuator; and
    a sensor associated with the haptic actuator;
    wherein the device is configured to:
    obtain a reference tactile signal to the haptic actuator;
    record, using the sensor associated with the haptic actuator, an output signal from the haptic actuator;
    provide the reference tactile signal and the output signal to an engine at the device;
    determine frequency regions of perceptual distortion from the output signal and the reference tactile signal;
    generate an adapted signal to reduce and equalize the perceptual distortion in the frequency regions of the perceptual distortion; and
    provide the adapted signal to the haptic actuator.

12. The device of claim 11, wherein the device is configured to generate the adapted signal by providing the reference tactile signal as the adapted signal when the engine detects no perceptible distortions.

13. The device of claim 11, wherein the engine comprises a first unit to transform the reference tactile signal and the output signal into perceptual representations.

14. The device of claim 13, wherein a perceptual representation is in a form:

$$p(\sigma) = \frac{1}{\sqrt{2\pi}\theta_\sigma} \int_{-\infty}^{\sigma} \exp\left[-\frac{(x-\tau_\sigma)^2}{2\theta_\sigma^2}\right] d\sigma$$

where:
p is a detection probability density;
G is a standard deviation of a vibrotactile stimulus that represents signal strength;
$\tau_\sigma$ is an acceleration threshold of the standard deviation; and
$\theta_\sigma$ is the standard deviation of normal distribution that controls a slope of detection probability variation.

15. The device of claim 14, wherein $$\tau_\sigma(f) = \frac{AccDT(f)}{\sqrt{2}} \text{ and}$$

$$\theta_\sigma = \frac{\tau_\sigma(f)}{k} \text{ where}$$

$$AccDT(f) = 4\pi^2 f^2 DT(f) \text{ and}$$

$$DT(f) \approx 282.184\left(-2.653 + \log(f+200)^2\right) - 20.$$

16. The device of claim 13, wherein the engine further includes a second unit to determine a degree of similarity between the perceptual representations of the reference tactile signal and the output signal obtained from the first unit.

17. The device of claim 16, wherein the degree of similarity is determined using:

$$SS(X, Y) = \frac{p(\sigma_X)p(\sigma_Y)}{p(\sigma_X)^2}$$

where:
SS is a spectral similarity value showing the degree of similarity;
X and Y are a frequency transform of the tactile reference signal and the output signal; and
$\sigma_X$ and $\sigma_Y$ are a local standard deviation of the tactile reference signal and the output signal respectively.

18. The device of claim 16, wherein the engine further includes a third unit to adjust an adaptation filter to target frequency bands with a threshold perceptual distortion level in the output signal.

19. The device of claim 18, wherein adjustment of the adaptation filter comprises adjusting a band-pass filter targeted at perceptual distortions over the threshold perceptual distortion level.

20. A non-transitory computer readable medium storing instruction code, which, when executed by a processor of a device, cause the device to:
obtain a reference tactile signal to a haptic actuator;
record, using a sensor associated with the haptic actuator, an output signal from the haptic actuator;
provide the reference tactile signal and the output signal to an engine at the device;
determine frequency regions of perceptual distortion from the output signal and the reference tactile signal;
generate an adapted signal to reduce and equalize the perceptual distortion in the frequency regions of the perceptual distortion; and
provide the adapted signal to the haptic actuator.

* * * * *